(12) United States Patent
Maeda et al.

(10) Patent No.: US 6,669,537 B2
(45) Date of Patent: Dec. 30, 2003

(54) RESIN DIAMOND BLADE AND OPTICAL WAVEGUIDE MANUFACTURING METHOD USING THE BLADE

(75) Inventors: Akio Maeda, Kawasaki (JP); Takashi Shiotani, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 109 days.

(21) Appl. No.: 10/102,687

(22) Filed: Mar. 22, 2002

(65) Prior Publication Data

US 2003/0104765 A1 Jun. 5, 2003

(30) Foreign Application Priority Data

Dec. 4, 2001 (JP) .......................... 2001-370603

(51) Int. Cl.⁷ .............................. B28B 1/02; B24B 7/19; B24B 7/30
(52) U.S. Cl. .............................. 451/41; 451/54; 125/12; 438/460
(58) Field of Search ............................. 29/830; 125/12, 125/15, 18; 51/298, 299, 300, 307, 309; 257/415, 420, 618; 438/464, 460; 451/41, 44, 57, 54, 58, 541, 542, 546

(56) References Cited

U.S. PATENT DOCUMENTS

| | | | | |
|---|---|---|---|---|
| 5,266,528 A | * | 11/1993 | Yamada | 83/49 |
| 6,055,976 A | * | 5/2000 | Davies et al. | 125/13.01 |
| 6,291,317 B1 | * | 9/2001 | Salatino et al. | 438/462 |
| 6,346,034 B1 | * | 2/2002 | Leng | 451/58 |
| 6,428,883 B1 | * | 8/2002 | White | 428/323 |
| 6,429,506 B1 | * | 8/2002 | Fujii et al. | 257/620 |
| 6,560,848 B2 | * | 5/2003 | Lee | 29/558 |

FOREIGN PATENT DOCUMENTS

| | | | |
|---|---|---|---|
| JP | 11-195627 | | 7/1999 |
| JP | 2001230221 A | * | 2/2000 |

\* cited by examiner

*Primary Examiner*—Timothy V. Eley
(74) *Attorney, Agent, or Firm*—Staas & Halsey LLP

(57) ABSTRACT

A silicon base optical waveguide manufacturing method including the steps of preparing a silicon wafer having a plurality of embedded optical waveguides, performing first-stage dicing of the silicon wafer to form a cut groove by using a first resin diamond blade having a thickness t1, and performing second-stage dicing of the silicon wafer along the cut groove to polish an end face of each optical waveguide by using a second resin diamond blade having a thickness t2 greater than the thickness t1. The second resin diamond blade includes diamond abrasive grains having a grain diameter of 2 μm or less, and the relation between the thicknesses t1 and t2 is set to $t1+0.01 \text{ mm} \leq t2 \leq t1+0.05 \text{ mm}$.

11 Claims, 3 Drawing Sheets

RESIN DIAMOND BLADE AND OPTICAL WAVEGUIDE MANUFACTURING METHOD USING THE BLADE

BACKGROUND OF THE INVENTION

1. Field of the Invention

The present invention relates to a resin diamond blade and a silicon base optical waveguide manufacturing method using the blade.

2. Description of the Related Art

An optical device using an optical waveguide is becoming increasingly necessary with the evolution of optical communication, and the development of optical components such as an optical brancher/coupler, optical multiplexer/demultiplexer, optical modulator, optical switch, and optical wavelength converter is accordingly becoming important. Typical examples of the optical waveguide well known in the art include an optical waveguide formed by diffusing Ti in a single-crystal substrate of $LiNbO_3$, an optical waveguide formed by depositing $SiO_2$ on a silicon substrate, and a polymer optical waveguide. A light incidence end face and a light emergence end face of the optical waveguide correspond to portions for optical coupling of lightwaves propagating in the optical waveguide and lightwaves propagating outside of the optical waveguide. Accordingly, the finished condition of each end face has an important effect on optical loss in the whole of the optical waveguide device.

Each end face of the optical waveguide is conventionally formed by various techniques such as polishing, cleaving, and cutting. The formation of the end face by polishing is superior both in surface roughness of a finished surface and in generation rate of chipping, and this technique is applied to a $LiNbO_3$ optical waveguide and a so-called silicon base optical waveguide formed by depositing $SiO_2$ on a silicon substrate. However, much time is required for polishing, causing a reduction in throughput and an increase in working cost. The formation of the end face by cleaving is applied to a semiconductor optical waveguide of GaAs, for example, and this technique has an advantage that the end face can be quickly obtained with smoothness at a crystal lattice level. However, since this technique is a method utilizing the anisotropy of crystal, the application of this method is limited to a high-cleavage orientation of a high-cleavage material, and this method cannot be applied to a low-cleavage material.

To the contrary, the formation of the end face by abrasive cutting using a diamond blade or the like is applicable also to a low-cleavage material. Moreover, this technique is superior in throughput and working cost because the end face can be formed faster than polishing. Accordingly, this abrasive cutting method has recently been examined as a method for forming the end faces of various optical waveguides. For example, Japanese Patent Laid-open No. Hei 8-68913 discloses a technique of simultaneously performing dicing of a silicon wafer and polishing of the end face of a silicon base optical waveguide by using a resin bonded diamond blade for cutting the optical-waveguide. According to this method described in the above publication, the silicon wafer having the optical waveguide is mounted on a bonded structure, and the resin bonded diamond blade is rotated at a high speed (18,000–35,000 rpm) to cut the silicon wafer being fed at an appropriate speed, thereby simultaneously performing dicing of the silicon wafer and polishing of the end face of the optical waveguide.

The optical waveguide manufacturing method described in the above publication has been followed by the present inventor. As the result, it has been found that the smoothness of the end face of the optical waveguide is insufficient and it cannot be put to practical use unless additional polishing is performed. That is, the end face of the optical waveguide must have a surface roughness (smoothness) of $\lambda/4$ or less where $\lambda$ is the wavelength of light for use, so as to sufficiently suppress optical loss in the whole of the optical waveguide device. However, such a smooth end face cannot be obtained by the method described in the above publication, according to the test made by the present inventor.

SUMMARY OF THE INVENTION

It is therefore an object of the present invention to provide a silicon base optical waveguide manufacturing method which can form a satisfactory end face of each optical waveguide.

It is another object of the present invention to provide a resin diamond blade which can perform polishing of the end face of each optical waveguide simultaneously with dicing of a silicon wafer.

In accordance with an aspect of the present invention, there is provided a silicon base optical waveguide manufacturing method comprising the steps of performing first-stage dicing of a silicon wafer having a silicon substrate and a plurality of optical waveguides formed on the silicon substrate to form a cut groove by using a first resin diamond blade having a thickness t1; and performing second-stage dicing of the silicon wafer along the cut groove to polish an end face of each of the optical waveguides by using a second resin diamond-blade having a thickness t2 greater than the thickness t1. The second resin diamond blade includes diamond abrasive grains having a grain diameter of 2 $\mu$m or less. The relation between the thickness t1 and the thickness t2 is set to t1+0.01 mm$\leq$e t2$\leq$t1+0.05 mm.

Preferably, the second resin diamond blade further includes cerium oxide abrasive grains having an average grain diameter of 0.1 to 5.0 $\mu$m and a purity of 35 to 95 wt %. More preferably, the total content of the diamond abrasive grains and the cerium oxide abrasive grains with respect to the volume of the second resin diamond blade is 20 to 40 vol %. Further the content of the cerium oxide abrasive grains with respect to the total volume of the diamond abrasive grains and the cerium oxide abrasive grains is 35 to 70 vol %. Further, the rotational speed of the first and second resin diamond blades is 10,000 to 30,000 rpm, and the depth of cut per stroke is 0.02 to 1.5 mm. More preferably, the feed speed of the silicon wafer is 0.1 to 1.5 mm/sec in cutting the optical waveguides and 0.1 to 5.0 mm/sec in cutting the silicon substrate.

In accordance with another aspect of the present invention, there is provided a silicon base optical waveguide manufacturing method comprising the steps of bonding a first silicon wafer having a plurality of optical waveguides on a second silicon wafer; performing first-stage dicing of the first and second silicon wafers to form a first cut groove by using a first resin diamond blade having a thickness t1; and performing second-stage dicing of the first and second-silicon wafers along the first cut groove to form a second cut groove shallower than the first cut groove by using a second resin diamond blade having a thickness t2 greater than the thickness t1. The second resin diamond blade includes diamond abrasive grains having a grain diameter of 2 $\mu$m or less.

Preferably, the second resin diamond blade further includes cerium oxide abrasive grains having an average grain diameter of 0.1 to 5.0 μm and a purity of 35 to 95 wt %.

In accordance with a further aspect of the present invention, there is provided a resin diamond blade comprising diamond abrasive grains having a grain diameter of 2 μm or less; cerium oxide abrasive grains having an average grain diameter of 0.1 to 5.0 μm and a purity of 35 to 95 wt %; and a bonding resin for bonding the diamond abrasive grains and the cerium oxide abrasive grains. The total content of the diamond abrasive grains and the cerium oxide abrasive grains with respect to the volume of the resin diamond blade is 20 to 40 vol %; the content of the cerium oxide abrasive grains with respect to the total volume of the diamond abrasive grains and the cerium oxide abrasive grains being 35 to 70 vol %.

Preferably, the cerium oxide abrasive grains have an average grain diameter of about 3 μm and a purity of about 60 wt %. Further, the total content of the diamond abrasive grains and the cerium oxide abrasive grains with respect to the volume of the resin diamond blade is about 25 vol %. The content of the cerium oxide abrasive grains with respect to the total volume of the diamond abrasive grains and the cerium oxide abrasive grains is about 50 vol %.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

Figure 1:
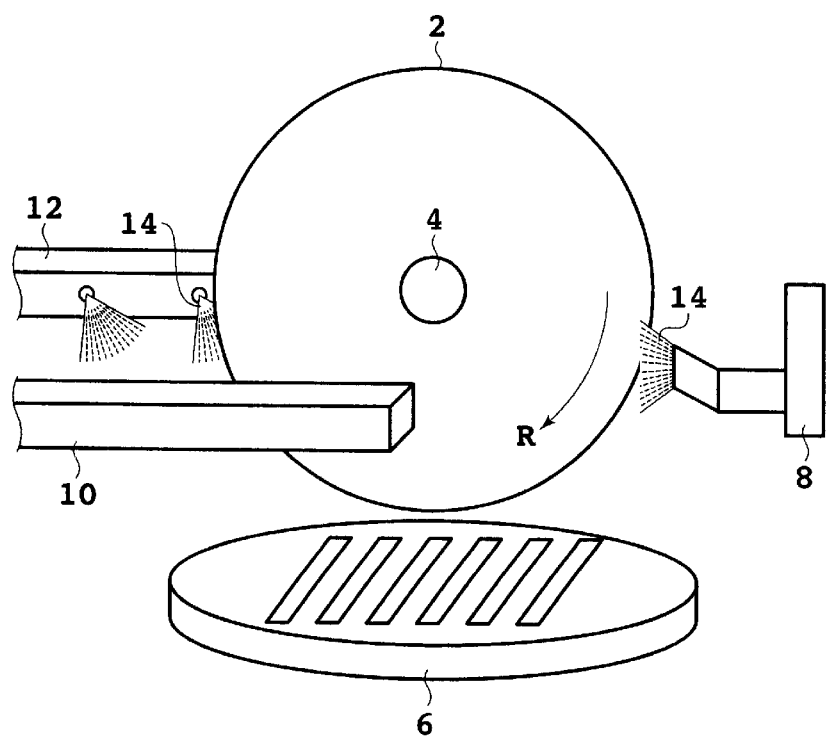
FIG. 1 is a schematic view of a dicing device usable in the optical waveguide manufacturing method according to the present invention.

Referring to FIG. 1, there is shown a schematic view of a dicing device usable in the optical waveguide manufacturing method according to the present invention. The dicing device has a spindle 4 on which a resin diamond blade 2 is mounted. The resin diamond blade 2 is rotated at a speed of about 10,000 to 30,000 rpm in a direction of arrow R by the rotation of the spindle 4. In a specific example, the resin diamond blade 2 is rotated at a speed of about 15,000 rpm. Reference numeral 6 denotes a silicon wafer having a plurality of embedded optical waveguides. During dicing of the silicon wafer 6 by the resin diamond blade 2, a cutting water 14 is sprayed from a front nozzle 8 and a pair of opposite side nozzles 10 and 12 onto the blade 2.

The cutting water 14 is preferably provided by pure water. However, normal water may be used as the cutting water 14. By spraying the cutting water 14 onto the resin diamond blade 2, chips generated by the dicing of the silicon wafer 6 are washed away by the cutting water 14, and loading of the resin diamond blade 2 is also prevented. The resin diamond blade 2 is detachably mounted on the spindle 4, so that various blades having different abrasive grain sizes are selectively used according to applications. For example, a blade having diamond abrasive grains with a grain size of #1000 (grain diameter of 8 to 20 μm) or a blade having diamond abrasive grains with a grain size of #6000 (grain diameter of 2 μm or less) may be used.

Figure 2:
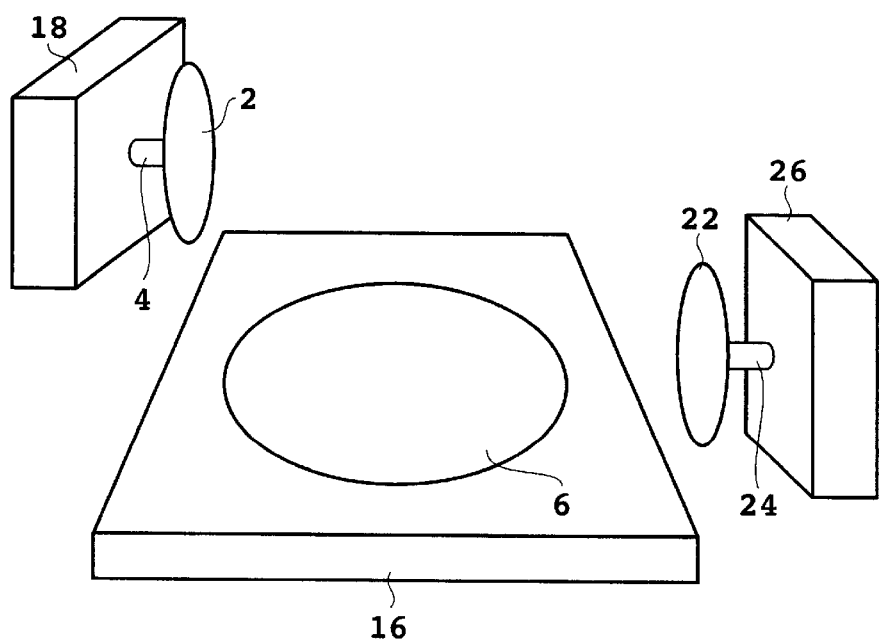
FIG. 2 is a schematic view of a double-cut dicing device.

FIG. 2 is a schematic view of a double-cut dicing device. The double-cut dicing device includes a first dicing unit 18 having a first resin diamond blade 2 and a second dicing unit 26 having a second resin diamond blade 22. Reference numeral 24 denotes a spindle in the second dicing unit 26. The first resin diamond blade 2 is used for first-stage-dicing, and the second resin diamond blade 22 is used for second-stage dicing. The first resin diamond blade 2 has relatively coarse diamond abrasive grains, and the second resin diamond blade 22 has relatively fine diamond abrasive grains. The silicon wafer 6 to be diced is set on a table 16 by suction, for example. The table 16 is movable in X and Y directions orthogonal to each other. The first and second resin diamond blades 2 and 22 are movable in a vertical direction (Z direction).

Figure 3:
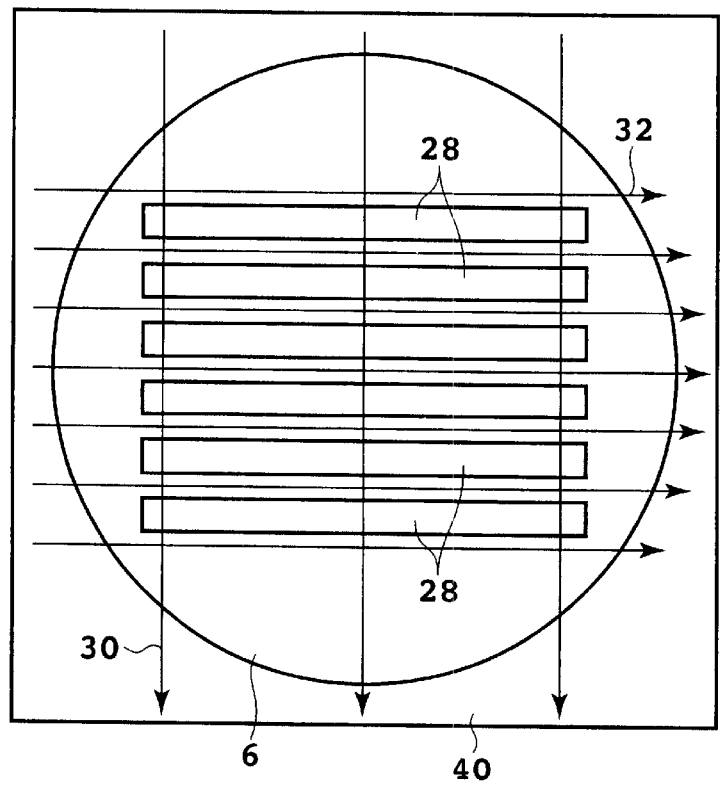
FIG. 3 is a plan view illustrating a dicing method for a silicon base optical waveguide work.
Figure 4:
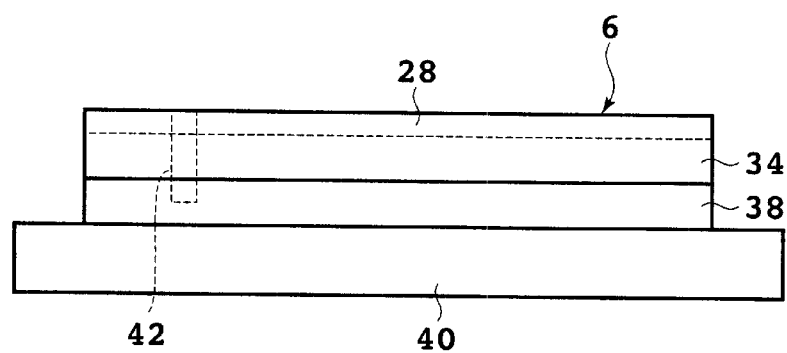
FIG. 4 is an elevational view of the silicon base optical waveguide work shown in FIG. 3.

FIG. 3 is a plan view illustrating a dicing method for a silicon base optical waveguide work (silicon wafer having optical waveguides) 6, and FIG. 4 is an elevational view of the silicon base optical waveguide work 6 shown in FIG. 3. As shown in FIG. 4, the silicon base optical waveguide work 6 is bonded by a wax to a lower silicon wafer 38 for dicing, and the lower silicon wafer 38 is bonded by a wax to a glass plate 40 for suction. Referring back to FIG. 3, the silicon wafer 6 is formed with a plurality of embedded optical waveguides 28 arrayed in one direction. The silicon wafer 6 is a 6-inch wafer, for example. Each optical waveguide 28 has a width of 5 to 10 mm, for example. The silicon wafer 6 is diced in the Y direction along three cutting lines 30 perpendicular to the longitudinal direction of the optical waveguides 28 and in the X direction along 5 to 15 cutting lines 32 parallel to the longitudinal direction of the optical waveguides 28, thereby cutting and separating the optical waveguides 28.

Referring again to FIG. 4, the silicon wafer 6 has a thickness of 1.04 mm. The silicon wafer 6 includes a silicon substrate 34 and the optical waveguides 28 of $SiO_2$ formed on the silicon substrate 34. Each optical waveguide 28 has a thickness of 0.04 mm. The lower silicon wafer 38 has a thickness of 1.00 mm, and the glass plate 40 has a thickness of 5.00 mm. Reference numeral 42 denotes a dicing stop position. According to the dicing method of the present invention, the silicon wafer 6 having the optical waveguides 28 is fully cut across its thickness, and the lower silicon wafer 38 is partially cut to such a depth as shown by the dicing stop position 42.

Figure 5A:
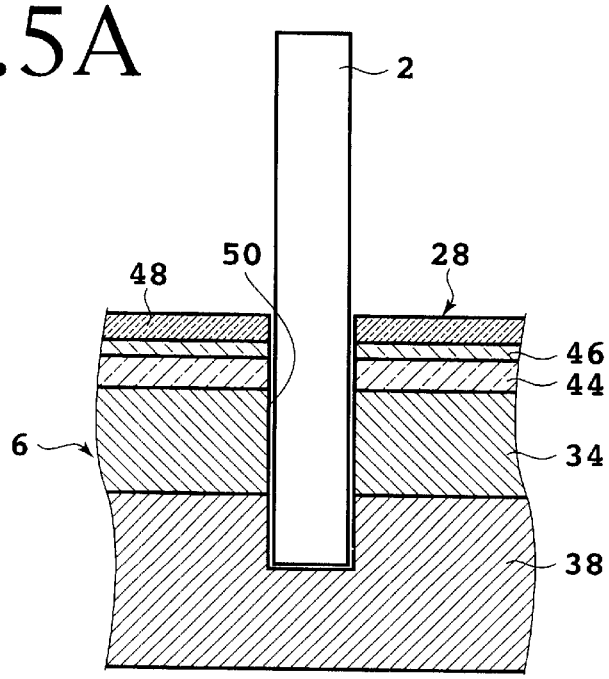
FIG. 5A is a sectional view illustrating first-stage dicing.

The resin diamond blade according to the present invention and the silicon base optical waveguide manufacturing method using this blade according to the present invention will now be described in more detail with reference to FIGS. 5A and 5B. The first resin diamond blade 2 shown in FIG. 5A is a known blade, which is configured by bonding diamond abrasive grains having a grain size of #1000 (grain diameter of 8 to 20 μm) with phenolic resin, for example. The first resin diamond blade 2 has an outer diameter of 76.2 mm and a thickness of 200 μm. The first resin diamond blade 2 is used for the first-stage dicing.

Figure 5B:
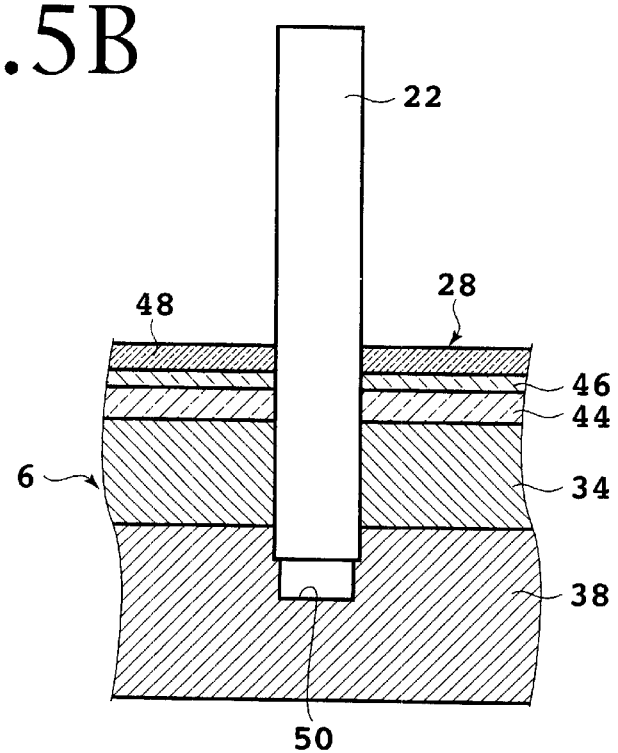
FIG. 5B is a sectional view illustrating second-stage dicing.

The second resin diamond blade 22 shown in FIG. 5B is a novel blade having the following configuration. The second resin-diamond blade 22 has an outer diameter of 76.2 mm and a thickness of 220 μm. In embodying the optical waveguide manufacturing method according to the present invention, the relation between the thickness t1 of the first resin diamond blade 2 and the thickness t2 of the second resin diamond blade 22 is especially important. This relation will be hereinafter described in detail.

The second resin diamond blade 22 has such a structure that diamond abrasive grains and cerium oxide abrasive grains adhere to a bonding resin as a resin bond. Thermosetting phenolic resin (e.g., manufactured by Sumitomo Durez Co., Ltd., solid content of 70%), polyimide resin, etc. may be adopted as the bonding resin. The diamond abrasive grains of the blade 22 preferably have a grain diameter of 2 μm or less, that is, finer than a grain size of #6000. If the grain diameter of the diamond abrasive grains is greater than 2 μm, a sufficient polishing performance cannot be exhibited. In other words, if diamond abrasive grains having a grain diameter of greater than 2 μm are used, a surface roughness of λ/4 or less required for the end face of the optical waveguide cannot be achieved, where λ is the wavelength of light propagating in the optical waveguide.

Preferably, the cerium oxide abrasive grains have an average grain diameter of 0.1 to 5.0 μm and a purity of 35 to 95 wt %. If the average grain diameter of the cerium oxide abrasive grains is less than 0.1 μm, the polishing rate becomes extremely low. Conversely, if the average grain diameter is greater than 5.0 μm, scratches due to the coarse grains are generated on the end face of the optical waveguide, causing an increase in the surface roughness. There are various purities of products for cerium oxide. If the content of cerium oxide in the cerium oxide abrasive grains is less than 35 wt %, the polishing performance of cerium oxide cannot be sufficiently exhibited because of a larger content of impurities, so that the polishing rate becomes extremely low. Conversely, if the content of cerium oxide in the cerium oxide abrasive grains is greater than 95 wt %, the polishing rate similarly becomes low. Moreover, an added cost of purification is required, causing an increase in unit price of the cerium oxide abrasive grains to result in an increase in polishing cost. In a specific example, the cerium oxide abrasive grains have an average grain diameter of about 3 μm and a purity of about 60 wt %.

Preferably, the total content of the diamond abrasive grains and the cerium oxide abrasive grains with respect to the volume of the blade 22 is 20 to 40 vol %. In a specific example, the total content of the diamond abrasive grains and the cerium oxide abrasive grains with respect to the volume of the blade 22 is set to about 25 vol %. Furthermore, the content of the cerium oxide abrasive grains with respect to the total volume of the diamond abrasive grains and the cerium oxide abrasive grains is preferably set to 35 to 70 vol %. In a specific example, the ratio of the diamond abrasive grains and the cerium oxide abrasive grains is set to about 1:1 by volume.

The second resin diamond blade 22 is manufactured in the following manner. The diamond abrasive grains, the cerium oxide abrasive grains, the phenolic resin powder (manufactured by Sumitomo Durez Co., Ltd., solid content of 70%), and additives (minute amounts of Cu, Ni, and Al) are mixed together with stirring. The contents of the diamond abrasive grains and the cerium oxide abrasive grains are equal to each other by vol %. The mixture thus prepared is charged into a given die, and pressed to be solidified. The molding thus obtained is next heat-treated at about 150° C. for three hours for hardening.

There will now be described in detail the two-stage dicing method according to the present invention using the first resin diamond blade 2 and the second resin diamond blade 22. As shown in FIG. 5A, the first-stage dicing of the silicon wafer 6 is performed by using the first resin diamond blade 2 having a thickness of 200 μm. The rotational speed of the first resin diamond blade 2 is set to 10,000 to 30,000 rpm. In a specific example, the speed is set to 15,000 rpm. The depth of cut by the first resin diamond blade 2 per stroke is set to 0.02 to 1.5 mm. In this case, the depth is set to 0.05 mm.

While the silicon wafer 6 is fed in the X direction or the Y direction during dicing, the feed speed of the silicon wafer 6 is set to 0.1 to 1.5 mm/sec, preferably, in cutting the optical waveguides 28 and 0.1 to 5.0 mm/sec, preferably, in cutting the silicon substrate 34 and the lower silicon wafer 38. In a specific example, the feed speed of the silicon wafer 6 is set to 0.2 mm/sec in cutting the optical waveguides 28 and 2.0 mm/sec in cutting the silicon substrate 34 and the lower silicon wafer 38.

As shown in FIG. 5A, the optical waveguides 28 of $SiO_2$ as a principal component are formed on the silicon substrate 34 by CVD. Each optical waveguide 28 includes an under cladding 44, a core 46, and an over cladding 48. Each of the under cladding 44 and the over cladding 48 is doped with B and P, and the core 46 is doped with Ge and P. In the first-stage dicing shown in FIG. 5A, the total depth of cut is set to 1.4 mm from the surface of each optical waveguide 28. Accordingly, the silicon wafer 6 is fully cut across its thickness of 1.04 mm, and the lower silicon wafer 38 is partially cut to its mid position of the thickness. The grain size of the diamond abrasive grains of the first resin diamond blade 2 is #1000 (grain diameter of 8 to 20 μm).

After the first-stage dicing is finished, the second-stage dicing shown in FIG. 5B is performed by using the second resin diamond blade 22 and applying it to a cut groove 50 formed in the first-stage dicing. The second resin diamond blade 22 has a thickness of 220 μm. The rotational speed of the second resin diamond blade 22 is set to 10,000 to 30,000 rpm. In this case, the speed is set to 15,000 rpm.

The depth of cut by the second resin diamond blade 22 per stroke is set to 0.02 to 1.5 mm. In a specific example, the depth is set to 0.05 mm. The feed speed of the silicon wafer 6 is set to 0.1 to 1.5 mm/sec, preferably, in cutting the optical waveguides 28 and 0.1 to 5.0 mm/sec, preferably, in cutting the silicon substrate 34 and the lower silicon wafer 38. In a specific example, the feed speed of the silicon wafer 6 is set to 0.2 mm/sec in cutting the optical waveguides 28 and 2.0 mm/sec in cutting the silicon substrate 34 and the lower silicon wafer 38. Both in the first-stage dicing and in the second-stage dicing, the cutting water 14 is sprayed at a rate of 1 liter/min from the front nozzle 8 and the side nozzles 10 and 12 onto the first and second resin diamond blades 2 and 22 as shown in FIG. 1. By spraying the cutting water, chips of the silicon wafers 6 and 38 during dicing are washed away and loading of the resin diamond blades 2 and 22 is prevented.

In the second-stage dicing shown in FIG. 5B, the total depth of cut is set to 1.2 mm, which is smaller than the total depth of cut in the first-stage dicing. By stopping the second-stage dicing at such a shallower cut position than that in the first-stage dicing, the chips of the silicon wafers 6 and 38 during the second-stage dicing can be sufficiently washed away by the cutting water. By the above-mentioned two-stage dicing, the end face of each optical waveguide 28 can be polished to a sufficient smoothness, i.e., a surface roughness of λ/4 or less. In particular, since the second resin diamond blade 22 includes a predetermined amount of cerium oxide abrasive grains, the smoothness of the end face of each optical waveguide 28 is considered to be improved. It is considered that chemical etching by the cerium oxide abrasive grains contributes to this improvement in smoothness. After the second-stage dicing is finished, the wax bonding the silicon wafer 6 to the lower silicon wafer 38 is melted to separate the silicon wafer 6 from the lower silicon wafer 38. Thus, a plurality of optical waveguide devices each having a sufficient smoothness at each end face can be manufactured.

The relation between the thickness t1 of the first resin diamond blade 2 and the thickness t2 of the second resin diamond blade 22 for obtaining a sufficient smoothness of the end face of each optical waveguide was examined by a test. The test results are shown in Table 1.

TABLE 1

| t1 (mm) | t2 (mm) | t2 − t1 (mm) | Evaluation |
| --- | --- | --- | --- |
| 0.157 | 0.233 | 0.076 | Poor |
| 0.185 | 0.230 | 0.045 | Good |
| 0.205 | 0.227 | 0.022 | Good |
| 0.209 | 0.225 | 0.016 | Good |
| 0.210 | 0.218 | 0.008 | Poor |

As understood from the results shown in Table 1, the relation of t1+0.01 mm≦t2≦t1+0.05 mm must be satisfied to obtain a sufficient smoothness of the end face of each optical waveguide.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A silicon base optical waveguide manufacturing method comprising the steps of:
   performing first-stage dicing of a silicon wafer having a silicon substrate and a plurality of optical waveguides formed on said silicon substrate to form a cut groove by using a first resin diamond blade having a thickness t1; and
   performing second-stage dicing of said silicon wafer along said cut groove to polish an end face of each of said optical waveguides by using a second resin diamond blade having a thickness t2 greater than said thickness t1;
   said second resin diamond blade including diamond abrasive grains having a grain diameter of 2 μm or less;
   the relation between said thickness t1 and said thickness t2 being set to t1+0.01 mm≦t2≦t1+0.05 mm.

2. A silicon base optical waveguide manufacturing method according to claim 1, wherein said second resin diamond blade further includes cerium oxide abrasive grains having an average grain diameter of 0.1 to 5.0 μm and a purity of 35 to 95 wt %.

3. A silicon base optical waveguide manufacturing method according to claim 2, wherein:
   the total content of said diamond abrasive grains and said cerium oxide abrasive grains with respect to the volume of said second resin diamond blade is 20 to 40 vol %; and
   the content of said cerium oxide abrasive grains with respect to the total volume of said diamond abrasive grains and said cerium oxide abrasive grains is 35 to 70 vol %.

4. A silicon base optical waveguide manufacturing method according to claim 2, wherein the rotational speed of said first and second resin diamond blades is 10,000 to 30,000 rpm, and the depth of cut per stroke is 0.02 to 1.5 mm.

5. A silicon base optical waveguide manufacturing method according to claim 4, wherein the feed speed of said silicon wafer is 0.1 to 1.5 mm/sec in cutting said optical waveguides and 0.1 to 5.0 mm/sec in cutting said silicon substrate.

6. A silicon base optical waveguide manufacturing method comprising the steps of:
   bonding a first silicon wafer having a plurality of optical waveguides on a second silicon wafer;
   performing first-stage dicing of said first and second silicon wafers to form a first cut groove by using a first resin diamond blade having a thickness t1; and
   performing second-stage dicing of said first and second silicon wafers along said first cut groove to form a second cut groove shallower than said first cut groove by using a second resin diamond blade having a thickness t2 greater than said thickness t1;
   said second resin diamond blade including diamond abrasive grains having a grain diameter of 2 μm or less.

7. A silicon base optical waveguide manufacturing method according to claim 6, wherein said second resin diamond blade further includes cerium oxide abrasive grains having an average grain diameter of 0.1 to 5.0 μm and a purity of 35 to 95 wt %.

8. A silicon base optical waveguide manufacturing method according to claim 7, wherein:
   the total content of said diamond abrasive grains and said cerium oxide abrasive grains with respect to the volume of said second resin diamond blade is 20 to 40 vol %; and
   the content of said cerium oxide abrasive grains with respect to the total volume of said diamond abrasive grains and said cerium oxide abrasive grains is 35 to 70 vol %.

9. A resin diamond blade comprising:
   diamond abrasive grains having a grain diameter of 2 μm or less;
   cerium oxide abrasive grains having an average grain diameter of 0.1 to 5.0 μm and a purity of 35 to 95 wt %;
   a bonding resin for bonding said diamond abrasive grains and said cerium oxide abrasive grains;
   the total content of said diamond abrasive grains and said cerium oxide abrasive grains with respect to the volume of said resin diamond blade being 20 to 40 vol %; and
   the content of said cerium oxide abrasive grains with respect to the total volume of said diamond abrasive grains and said cerium oxide abrasive grains being 35 to 70 vol %.

10. A resin diamond blade according to claim 9, wherein said cerium oxide abrasive grains have an average grain diameter of about 3 μm and a purity of about 60 wt %.

11. A resin diamond blade according to claim 9, wherein:
   the total content of said diamond abrasive grains and said cerium oxide abrasive grains with respect to the volume of said resin diamond blade is about 25 vol %; and
   the content of said cerium oxide abrasive grains with respect to the total volume of said diamond abrasive grains and said cerium oxide abrasive grains is about 50 vol %.

* * * * *